(12) United States Patent
Chen et al.

(10) Patent No.: US 8,955,580 B2
(45) Date of Patent: Feb. 17, 2015

(54) USE OF A GRAPHITE HEAT-DISSIPATION DEVICE INCLUDING A PLATING METAL LAYER

(75) Inventors: Ko-Chun Chen, Kaohsiung (TW); Chiu-Lang Lin, Fongshan (TW)

(73) Assignee: Wah Hong Industrial Corp., Kaohsiung (TW)

( * ) Notice: Subject to any disclaimer, the term of this patent is extended or adjusted under 35 U.S.C. 154(b) by 22 days.

(21) Appl. No.: 13/108,983

(22) Filed: May 16, 2011

(65) Prior Publication Data

US 2011/0214851 A1    Sep. 8, 2011

Related U.S. Application Data

(63) Continuation-in-part of application No. 12/541,677, filed on Aug. 14, 2009.

(51) Int. Cl.
*F28F 13/18*        (2006.01)
*F28F 7/00*         (2006.01)

(52) U.S. Cl.
CPC .................................... *F28F 7/00* (2013.01)
USPC ......................... 165/133; 165/185; 165/80.3

(58) Field of Classification Search
USPC .................... 165/80.3, 133, 185, 186, 905
See application file for complete search history.

(56) References Cited

U.S. PATENT DOCUMENTS

| 3,393,134 | A |   | 7/1968  | Schwartz |
|-----------|---|---|---------|----------|
| 4,495,378 | A | * | 1/1985  | Dotzer et al. ................. 174/252 |
| 4,878,152 | A |   | 10/1989 | Sauzade et al. |
| 4,936,939 | A | * | 6/1990  | Woolum ........................ 156/285 |
| 4,961,991 | A |   | 10/1990 | Howard |
| 5,149,518 | A |   | 9/1992  | Getz et al. |
| 5,176,863 | A |   | 1/1993  | Howard |
| 5,198,063 | A |   | 3/1993  | Howard et al. |
| 5,372,701 | A | * | 12/1994 | Gerdon et al. ................ 205/210 |
| 5,523,260 | A | * | 6/1996  | Missele ......................... 156/330 |
| 5,730,853 | A | * | 3/1998  | Smith et al. ................... 205/210 |
| 5,830,809 | A |   | 11/1998 | Howard et al. |
| 5,991,155 | A |   | 11/1999 | Kobayashi et al. |
| 6,075,287 | A |   | 6/2000  | Ingraham et al. |
| 6,075,701 | A |   | 6/2000  | Ali et al. |
| 6,097,598 | A |   | 8/2000  | Miyahara et al. |
| 6,147,301 | A |   | 11/2000 | Bhatia |
| 6,194,685 | B1|   | 2/2001  | Rutherford |

(Continued)

FOREIGN PATENT DOCUMENTS

| CN | 1679383 A   | 10/2005 |
|----|-------------|---------|
| CN | 200953714 Y | 9/2007  |

(Continued)

OTHER PUBLICATIONS

W. Nakayama, Recent Japanese Thermal Solutions for Portable Computers, Electronics Cooling, Sep. 1, 1998.

(Continued)

*Primary Examiner* — Marc Norman
*Assistant Examiner* — Devon Russell
(74) *Attorney, Agent, or Firm* — Ascenda Law Group PC

(57) ABSTRACT

The present invention relates to a heat-dissipating device for an electronic device, comprising a graphite planar body, one or more metal layers, an insulation film and an adhesive. The heat-dissipating device is optionally attached to a heat sink. The method of using the heat-dissipating device to dissipate heat is also disclosed.

6 Claims, 11 Drawing Sheets

(56) References Cited

U.S. PATENT DOCUMENTS

| | | | |
|---|---|---|---|
| 6,245,400 B1 | 6/2001 | Tzeng et al. | |
| 6,387,462 B1 | 5/2002 | Blain et al. | |
| 6,395,199 B1 | 5/2002 | Krassowski et al. | |
| 6,432,336 B1 | 8/2002 | Mercuri et al. | |
| 6,440,331 B1 * | 8/2002 | Carano et al. | 252/506 |
| 6,482,520 B1 * | 11/2002 | Tzeng | 428/408 |
| 6,498,355 B1 * | 12/2002 | Harrah et al. | 257/99 |
| 6,503,626 B1 | 1/2003 | Norley et al. | |
| 6,538,892 B2 | 3/2003 | Smalc | |
| 6,582,100 B1 * | 6/2003 | Hochstein et al. | 362/294 |
| 6,673,284 B2 | 1/2004 | Mercuri et al. | |
| 6,691,912 B2 * | 2/2004 | Carano et al. | 228/256 |
| 6,746,768 B2 | 6/2004 | Greinke et al. | |
| 6,749,010 B2 | 6/2004 | Getz, Jr. et al. | |
| 6,758,263 B2 | 7/2004 | Krassowski et al. | |
| 6,771,502 B2 | 8/2004 | Getz, Jr. et al. | |
| 6,777,086 B2 | 8/2004 | Norley et al. | |
| 6,835,453 B2 | 12/2004 | Greenwood et al. | |
| 6,841,250 B2 | 1/2005 | Tzeng | |
| 6,886,249 B2 | 5/2005 | Smalc | |
| 6,907,917 B2 * | 6/2005 | Chu et al. | 165/80.3 |
| 6,982,874 B2 | 1/2006 | Smalc et al. | |
| 6,999,318 B2 * | 2/2006 | Newby | 361/719 |
| 7,108,055 B2 * | 9/2006 | Krassowski et al. | 165/185 |
| 7,108,917 B2 | 9/2006 | Klug | |
| 7,138,029 B2 | 11/2006 | Capp et al. | |
| 7,150,914 B2 | 12/2006 | Capp et al. | |
| 7,160,619 B2 | 1/2007 | Capp et al. | |
| 7,161,809 B2 | 1/2007 | Ford et al. | |
| 7,166,912 B2 | 1/2007 | Krassowski et al. | |
| 7,186,309 B2 | 3/2007 | Mercuri et al. | |
| 7,192,163 B2 * | 3/2007 | Park | 362/294 |
| 7,232,601 B2 | 6/2007 | Mercuri et al. | |
| 7,254,888 B2 * | 8/2007 | Chu et al. | 29/840 |
| 7,276,273 B2 | 10/2007 | Clovesko et al. | |
| 7,292,441 B2 | 11/2007 | Smalc et al. | |
| 7,303,005 B2 | 12/2007 | Reis et al. | |
| 7,303,820 B2 * | 12/2007 | Capp et al. | 428/408 |
| 7,306,847 B2 | 12/2007 | Capp et al. | |
| 7,365,988 B2 | 4/2008 | Frastaci et al. | |
| 7,385,819 B1 | 6/2008 | Hoffert et al. | |
| 7,393,587 B2 * | 7/2008 | Krassowski et al. | 428/408 |
| 7,420,810 B2 | 9/2008 | Reis et al. | |
| 7,494,712 B2 | 2/2009 | Norley et al. | |
| 7,505,275 B2 | 3/2009 | Cartiglia et al. | |
| 7,510,304 B2 * | 3/2009 | Mukai | 362/294 |
| 7,527,855 B2 | 5/2009 | Lewis et al. | |
| 7,573,717 B2 | 8/2009 | Frastaci et al. | |
| 7,592,695 B2 | 9/2009 | Reis et al. | |
| 7,625,104 B2 * | 12/2009 | Zhang et al. | 362/294 |
| 7,658,999 B2 | 2/2010 | Clovesko et al. | |
| 7,666,270 B1 | 2/2010 | Smalc et al. | |
| 7,794,114 B2 * | 9/2010 | Medendorp, Jr. | 362/294 |
| 7,799,309 B2 | 9/2010 | Grinke et al. | |
| 7,799,428 B2 | 9/2010 | Fujiwara et al. | |
| 7,889,502 B1 | 2/2011 | Cartiglia et al. | |
| 7,952,114 B2 * | 5/2011 | Gingrich, III | 257/99 |
| 8,128,750 B2 * | 3/2012 | Kenworthy et al. | 118/715 |
| 8,287,975 B2 * | 10/2012 | Ohta et al. | 428/42.2 |
| 2002/0139686 A1 * | 10/2002 | Carano et al. | 205/183 |
| 2002/0163076 A1 * | 11/2002 | Tzeng et al. | 257/720 |
| 2004/0094424 A1 * | 5/2004 | Franz | 205/159 |
| 2004/0118553 A1 | 6/2004 | Krassowski et al. | |
| 2005/0116235 A1 * | 6/2005 | Schultz et al. | 257/79 |
| 2005/0150649 A1 | 7/2005 | Tsukamoto | |
| 2005/0270746 A1 | 12/2005 | Reis | |
| 2006/0070720 A1 | 4/2006 | Capp et al. | |
| 2006/0099406 A1 | 5/2006 | Norley et al. | |
| 2006/0255341 A1 | 11/2006 | Pinnington | |
| 2006/0290251 A1 | 12/2006 | Shives et al. | |
| 2006/0290875 A1 | 12/2006 | Shives et al. | |
| 2006/0292461 A1 | 12/2006 | Shives et al. | |
| 2007/0042188 A1 | 2/2007 | Clovesko et al. | |
| 2007/0189011 A1 * | 8/2007 | Song et al. | 362/294 |
| 2007/0218284 A1 * | 9/2007 | Wu | 428/408 |
| 2007/0221369 A1 | 9/2007 | Getz, Jr. et al. | |
| 2007/0232498 A1 * | 10/2007 | Uchida et al. | 505/150 |
| 2007/0257359 A1 | 11/2007 | Reis et al. | |
| 2008/0087911 A1 * | 4/2008 | Stoyan | 257/99 |
| 2008/0149322 A1 * | 6/2008 | Ottinger et al. | 165/185 |
| 2008/0166492 A1 * | 7/2008 | Lu et al. | 427/432 |
| 2008/0176005 A1 * | 7/2008 | Wu et al. | 427/540 |
| 2009/0015134 A1 * | 1/2009 | Lin | 313/498 |
| 2009/0227070 A1 * | 9/2009 | Miyajima | 438/113 |
| 2009/0303685 A1 | 12/2009 | Chen | |
| 2010/0243230 A1 | 9/2010 | Chen et al. | |

FOREIGN PATENT DOCUMENTS

| | | |
|---|---|---|
| CN | 101193837 A | 6/2008 |
| CN | 101865627 A | 10/2010 |
| JP | 1179830 A | 7/1999 |
| TW | I247572 | 1/2006 |
| TW | 200815726 A | 4/2008 |
| WO | WO9856734 A1 | 12/1998 |

OTHER PUBLICATIONS

Shuler, Thermal management: understanding how to incorporate effective thermal strategies into overall portable electronic design for better performance, Material and Design 21 (2000) 39-44.

T.T. Lee et al., Thermal Management of Handheld Telecommunication Products, Electronics Cooling, May 1, 1998.

Office Action Issued in U.S. Appl. No. 13/366,353 on Feb. 15, 2013, 8 pages.

First Action Interview Pilot Program Pre-Interview Communication issued in U.S. Appl. No. 12/541,677 on Jan. 4, 2013, 5 pages.

Office Action Issued in corresponding Chinese Application No. 201210151422.X on Aug. 1, 2014.

* cited by examiner

USE OF A GRAPHITE HEAT-DISSIPATION DEVICE INCLUDING A PLATING METAL LAYER

CROSS-REFERENCE TO RELATED APPLICATION

This application is a continuation-in-part application of co-pending U.S. patent application Ser. No. 12/541,677, filed on 14 Aug. 2009, which is hereby incorporated by reference in its entirety.

BACKGROUND OF THE INVENTION

1. Field of the invention

This invention relates to a heat-dissipating device, more particularly to a heat-dissipating device including a plating metal layer formed on a graphite laminate. This invention also relates to the use of the heat-dissipating device including one or more plating metal layers to dissipate heat in an electronic device.

2. Description of the related art

A heat-dissipating device made from metal having a high conductivity, such as copper or aluminum, is usually used for dissipating heat generated in electronic components into ambient air. When the operating speed of the electronic components is faster, a rate of heat generation is increased. Therefore, a large heat-dissipating area of the heat-dissipating device is required so as to quickly dissipate heat. However, such requirement increases a weight of the heat-dissipating device.

Compared to copper or aluminum, graphite has advantages such as low heat resistance, light weight, and high conductive coefficient. However, since graphite has insufficient mechanical strength due to its flexibility and is frangible, graphite is likely to be damaged and to be deformed due to impact or stress during use. In addition, since graphite cannot bond directly to metal or alloy by welding, graphite itself is not used as the heat-dissipating device.

An existing method of making a heat-dissipating device is generally carried out by adhering a metal layer to graphite for improving rigidity and strength thereof. Subsequently, electronic components are connected to the graphite by adhering to the metal layer. However, the metal layer is likely to separate from the graphite, and heat conduction can be discontinuous due to the adhesive between the metal layer and the graphite, which reduces heat conduction efficiency.

SUMMARY OF THE INVENTION

Therefore, an object of the present invention is to provide a heat-dissipating device that can overcome the aforesaid drawbacks associated with the prior art.

Another object of this invention is to provide a method of making the heat-dissipating device.

According to one aspect of the present invention, a heat-dissipating device comprises: a planar body made of a graphite laminate and extending along an x-y plane of the graphite laminate; and a plating metal layer formed on the planar body.

According to another aspect of the present invention, a method of making the heat-dissipating device comprises: (a) cleaning a planar body that is made of a graphite laminate and that extends along an x-y plane of the graphite laminate; and (b) electroplating the planar body so that a plating metal layer is formed on the planar body.

Another object of this invention is to provide a method for dissipating heat from the heat source using the heat-dissipating device. The method includes the following steps:
(a) placing the heat-dissipating device 2 in contact with a heat source 100 in an electronic device;
(b) conducting heat from the heat source 100 across the thickness of the metal layer 22 in z plane; and
(c) conducting the heat from the metal layer 22 to the planar body and spread along the x-y plane.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
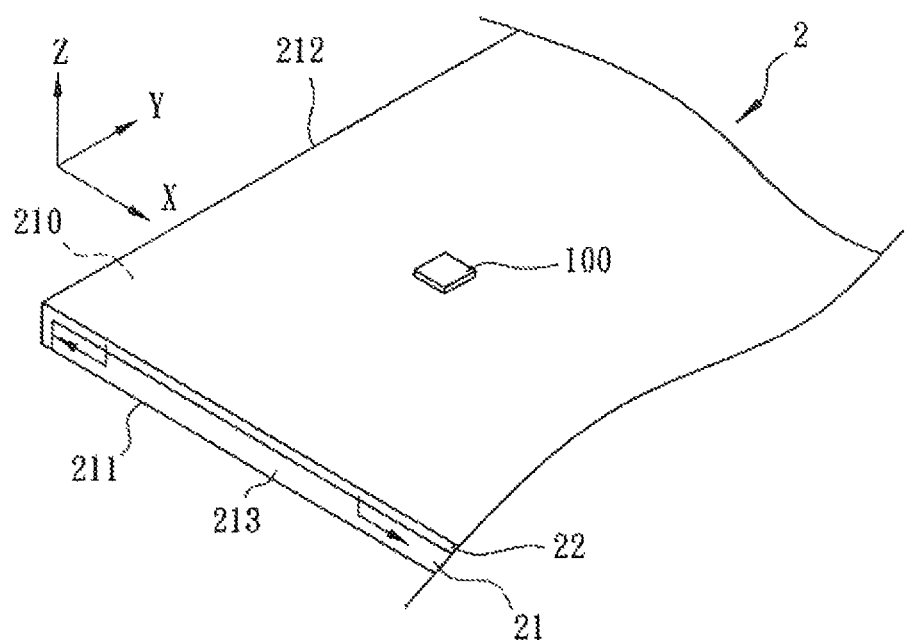
FIG. 1 is a perspective view of the first preferred embodiment of a heat-dissipating device according to this invention.

Embodiments of the present invention may be described with reference to the accompanying drawings. Unless otherwise defined, identical elements are denoted by the same reference numerals throughout the disclosure and all technical and scientific terms used herein have the same meaning as commonly understood by one of ordinary skill in the art to which this invention belongs.

Referring to FIG. 1, the first preferred embodiment of a heat-dissipating device 2 according to this invention includes a planar body 21 and a plating metal layer 22.

The planar body 21 is made of a graphite laminate and extends along an x-y plane of the graphite laminate. Compared to metal, such as copper or aluminum, graphite has low heat resistance, light weight, and high conductive coefficient. In addition, graphite has excellent conduction of heat in the x-y plane and insulation against heat in the direction (z) perpendicular to the x-y plane.

The plating metal layer 22 is formed on the planar body 21 through electroplating. By forming the plating metal layer 22, and electronic component 100, depending on actual requirements, can be mounted on the plating metal layer 22 of the heat-dissipating device 2 through welding or adhesion. Since electroplating is to form a dense metal film through film nucleation and growth, when the plating metal layer 22 is electroplated on the planar body 21, the plating metal layer 22 can be tightly attached to the planar body 21, thereby conducting heat generated from the electronic component 100 to ambient air along the x-y plane of the graphite laminate of the planar body 21.

In this embodiment, the planar body 21 has top and bottom surfaces 210, 211 which extend parallel to the x-y plane, and a pair of opposite first lateral sides 212 (only one is shown) and opposite second lateral sides 213 (only one is shown), which interconnect the top and bottom surfaces, 210, 211. The plating metal layer 22 is formed on the top surface 210 and the opposite first lateral sides 212.

The plating metal layer 22 is selected from the group consisting of copper, nickel, chromium, gold, silver, tin, platinum, and combinations thereof, which have high heat conductivity. Due to high heat conductivity, heat dissipation efficiency is not reduced by forming the plating metal layer 22 on the planar body 21, but is actually increased. The heat-dissipating device 2 can increase the heat dissipation efficiency up to 10%-15% compared to a heat-dissipating device including merely graphite laminate. In addition, due to the presence of the plating metal layer 22, the planar body 21 is provided with increased surface hardness and rigidity.

Figure 2:
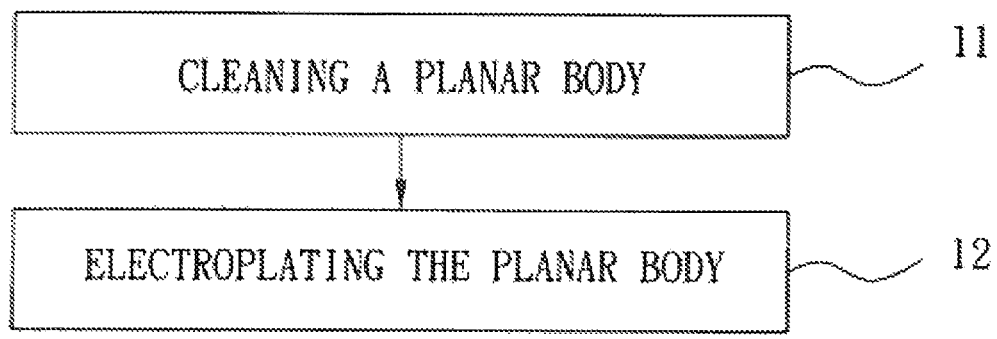
FIG. 2 is a flowchart illustrating that first preferred embodiment of a method for making the heat-dissipating device according to this invention.

Referring to FIG. 2, a method of making the heat-dissipating device 2 includes steps 11 and 12.

In step 11, the planar body 21 is cleaned so as to remove oil contaminant and oxide thereon.

Preferably, the cleaning is conducted by using acid solution. Alternatively, the cleaning can be conducted by using atmospheric pressure plasma, In this embodiment, the planar body 21 is immersed for 50 sec in a solution including sulfuric acid having a concentration of not less than 0.5 wt %, such as a concentration of 10 wt %, and a surfactant so as to remove contaminant on the surface of the planar body 21. After washing, with water, the planar body is immersed in sulfuric acid having a concentration of 3-5 wt% for 30 sec so as to enhance effect on removal of oil contaminant and oxide.

In step 12, the planar body 21 is electroplated so that the plating metal layer 22 is formed on the planar body 21 so as to obtain the heat-dissipating device 2. The plating metal layer 22 preferably has a layer thickness not less than 1 μm.

Figure 3:
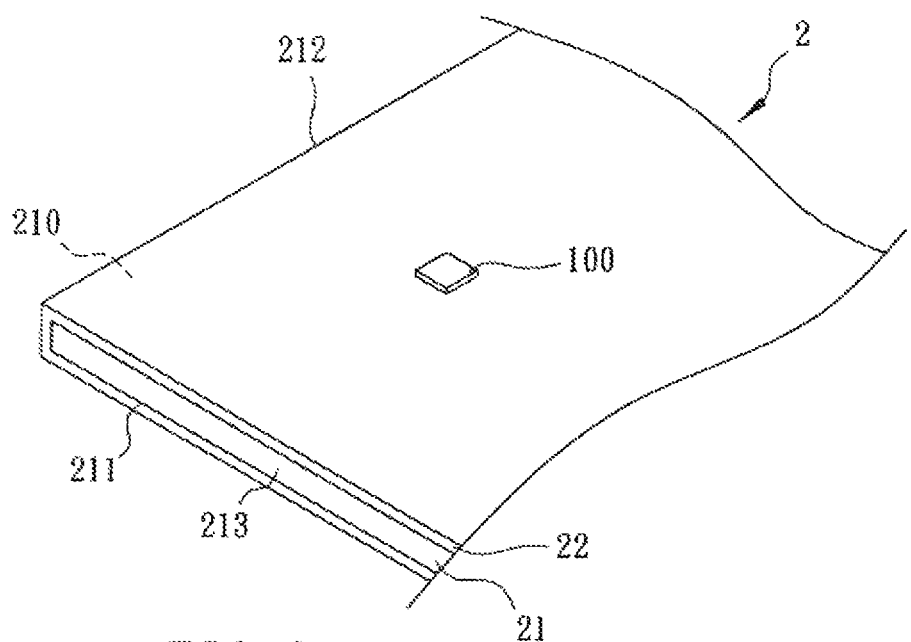
FIG. 3 is a perspective view of the second preferred embodiment of the heat-dissipating device according to this invention.

Referring to FIG. 3, the second preferred embodiment of the present invention differs from the first preferred embodiment in that the plating metal layer 22 is further formed on the bottom surface 211, which can prevent graphite dust from contaminating other components and improve the heat dissipation efficiency of the heat-dissipating device 2. The electronic component 100 can be disposed on any surface of the planar body 21.

Figure 4:
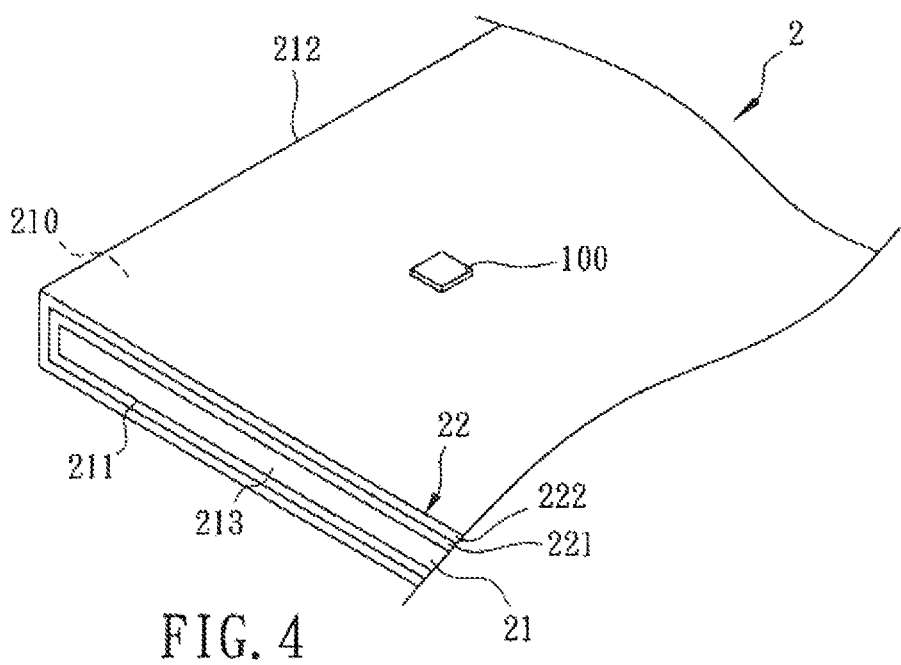
FIG. 4 is a perspective view of the third preferred embodiment of the heat-dissipating device according to this invention.

Referring to FIG. 4, the third preferred embodiment of the present invention differs from the second preferred embodiment in that the plating metal layer 22 includes a plurality of different metal or alloy films, in this embodiment, the plating metal layer 22 includes two metal films wherein a copper film 221 having a thickness ranging from 8 μm to 10 μm is firmed on the planar body 21, and a nickel film 222 having a thickness ranging from 2 μm to 5 μm is formed on the copper film 221. The total thickness of the plating metal layer 22 is not less than 1 μm for preventing the plating metal layer 22 from separating from the planar body 21 and for avoiding insufficiency of structural strength.

Figure 5:
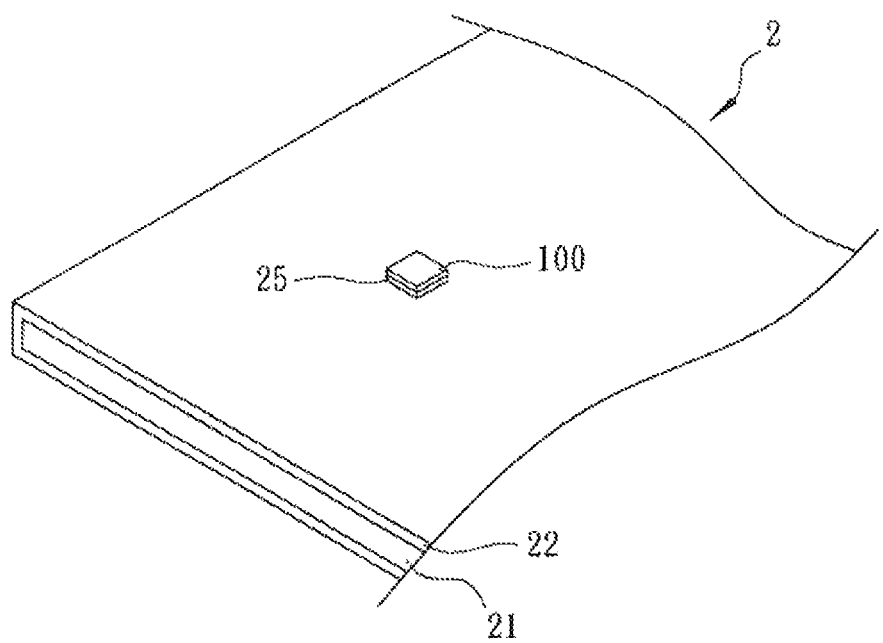
FIG. 5 is a perspective view of the fourth preferred embodiment of the heat-dissipating device according to this invention.

Referring to FIG. 5, the fourth preferred embodiment of the present invention differs from the second preferred embodiment in that the heat-dissipating device 2 further includes a heat conductive adhesive 25 disposed between the electronic component 100 and the heat-dissipating device 2 so as to assist in heat removal.

Figure 6:
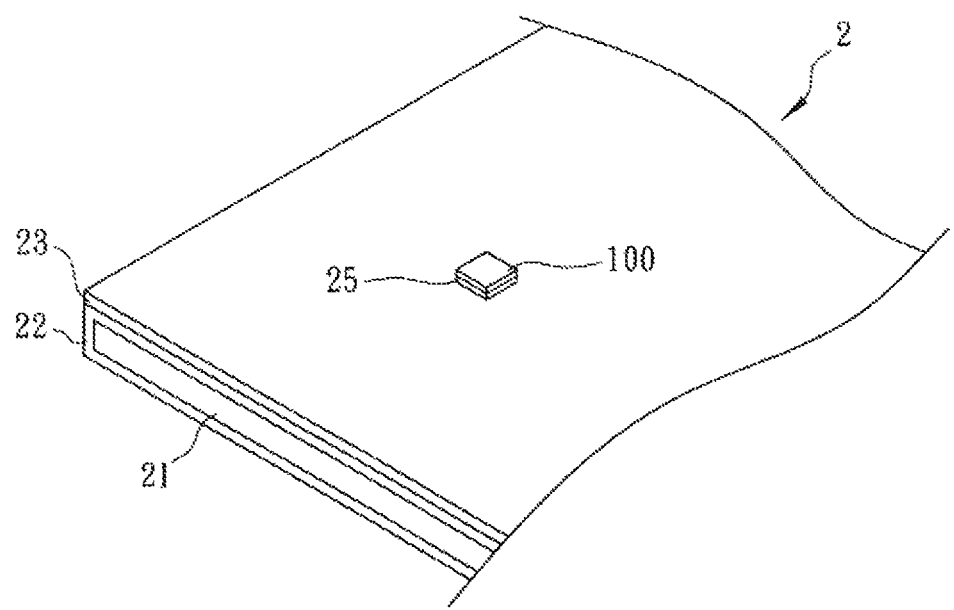
FIG. 6 is perspective view of the fifth preferred embodiment of the heat-dissipating device according to this invention.

Referring to FIG. 6, the fifth preferred embodiment of the present invention differs from the fourth preferred embodiment in that the heat-dissipation device 2 further includes an insulation film 23 attached to the plating metal layer 22 for electrical insulation between the electronic component 100 and the heat-dissipation device 2. In this embodiment, the insulation film 23 is made from polyethylene terephthalate (PET), and the electronic component 100 which needs to be electrically insulated is mounted on the insulation film 23 through the heat conductive adhesive 25.

Figure 7:
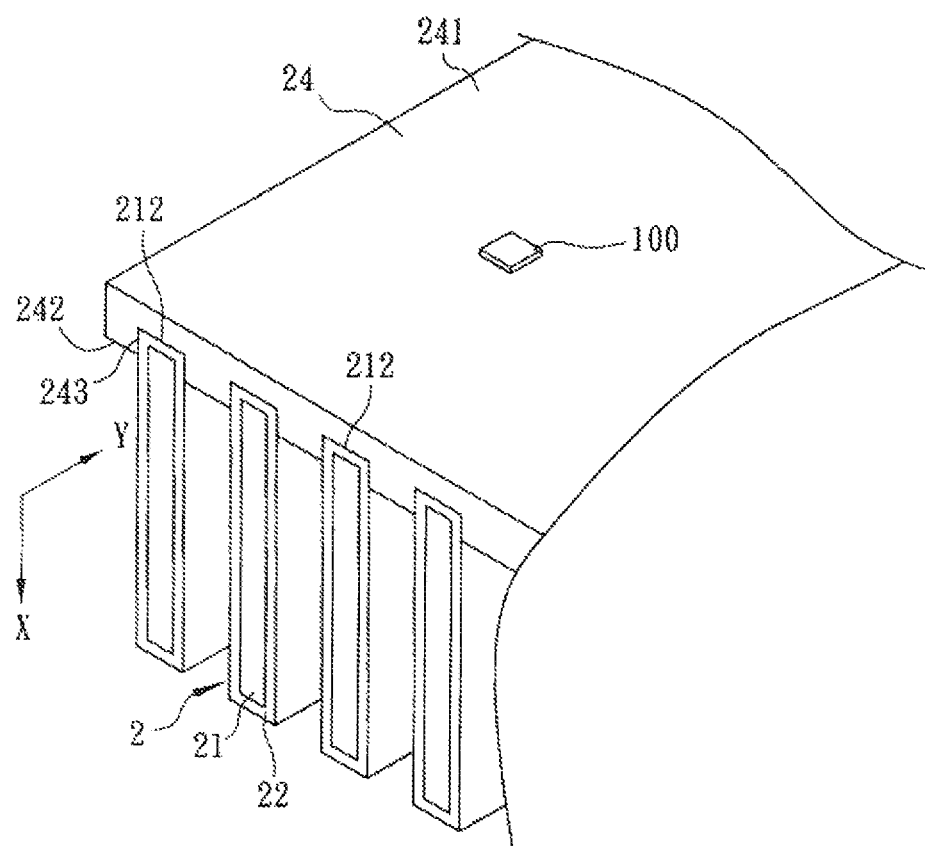
FIG. 7 is a perspective view of the sixth preferred embodiment of the heat-dissipating device according to this invention.

Referring to FIG. 7, the sixth preferred embodiment of the present invention includes a metal panel 24 and a plurality of the planar bodies 21. Each of the planar bodies 21 is formed with the plating metal layer 22. The metal. panel 24 has a first surface 241 adapted to support and contact the electronic component 100 and an opposite second surface 242 provided with a plurality of parallel elongated grooves 243.

The planar bodies 21 are substantially perpendicular to the second surface 242. One of the first lateral sides 212 of each planar body 21 is inserted into a respective one of the elongated grooves 243. A portion of the plating metal layer 22 covering the inserted first lateral side 212 of each planar body 21 is secured to the metal panel 24 by welding or adhesive bonding. In use, the heat generated by the electronic component 100 is transferred to the metal panel 24 and is dissipated through the planar bodies 21.

With the invention thus explained, it is apparent that various modifications and variations can be made without departing from the spirit of the present invention. It is therefore intended that the invention be limited only as recited in the appended claims.

Referring to FIG. 1, the first preferred embodiment of a heat-dissipating device 2 according to this invention includes a planar body 21 and a plating metal layer 22.

The planar body 21 is made of a graphite laminate and extends along the x-y plane of the graphite laminate. Compared to metal, such as copper or aluminum, graphite has low heat resistance, high conductive coefficient and is light weight. In addition, graphite has excellent conduction of heat in the x-y planes and low heat conduction in the z direction (i.e., anisotropic).

The metal layer 22 is formed on the planar body 21 through electroplating. Electroplating is a process of forming a dense metal film through film nucleation and growth, so the metal layer 22 is tightly attached to the planar body 21. The heat-generating electronic component (i.e. heat source) 100, is mounted to the metal layer 22 of the heat-dissipating device 2 through welding, adhesion or various known methods.

In this embodiment, the planar body 21 has a top surface 210 and a bottom surface 211, which extend in the x-y plane. In addition, the planar body 21 has a pair of first lateral sides 212 (only one is shown) and a pair of second lateral sides 213 (only one is shown), which interconnect the top and bottom surfaces, 210 and 211. The metal layer 22 is formed on the top surface 210 and the first lateral sides 212.

The metal layer 22 is selected from the group consisting of copper, nickel, chromium, gold, silver, tin, platinum, and combinations thereof, which has high thermal conductivity.

Due to the high thermal conductivity of the metal layer, the heat dissipation efficiency of the heat-dissipating device with a metal layer is increased by 10%-15% compared to a heat-dissipating device without the metal layer. In addition, the metal layer 22 enhances the structural strength and increases the rigidity of the planar body 21.

FIG. 2 shows the method of making the heat-dissipating device 2, comprising steps 11 and 12.

In step 11, the planar body 21 can be cleaned an acid solution or an atmospheric pressure plasma.

In one embodiment, the planar body 21 is cleaned by an acid solution with the following steps:
(a) removing oil contaminant by immersing the planar body in a 10 wt % sulfuric acid solution and a surfactant for 50 seconds so as to remove contaminant on the surface of the planar body;
(b) rinsing the planar body with water; and
(c) immersing the planar body 21 is in sulfuric acid having a concentration of 3-5 wt % for 30 sec so as to enhance the removal of the oil contaminant and oxidize effect. Preferably, the acid solution is sulfuric acid and the concentration of the sulfuric acid is not less than 0.5 wt %.

In step 12, one or more surfaces of the planar body 21 are electroplated with the metal layer 22 to form the heat-dissipating device 2. The metal layer 22 preferably has a layer thickness not less than 1 μm.

Referring to FIG. 3, the second preferred embodiment of the present invention differs from the first preferred embodiment in that a metal layer 22 is formed on the bottom surface 211 of the planar body. The bottom surface metal layer 211 can prevent graphite dust from contaminating other components and improve the heat dissipation efficiency of the heat-dissipating device 2. The electronic component 100 can he disposed on any surface of the planar body 21.

Referring to FIG. 4, the third preferred embodiment of the present invention differs from the second preferred embodiment in that there is one or more metal layer 22. In this embodiment, there are two metal layers 22 wherein a copper layer 221 having a thickness ranging from 8 μm to 10 μm is formed on the planar body 21, and a nickel film 222 having a thickness ranging from 2 μm to 5 μm is formed on the copper film 221, The total thickness of all the plating metal layers 22 is not less than 1μm to prevent the separation of the metal layer 22 from the planar body 21 and to ensure sufficient structural strength.

Referring to FIG. 5, the fourth preferred embodiment of the present invention differs from the second preferred embodiment in that a heat conductive adhesive 25 is disposed between the electronic component 100 and the heat-dissipating device 2 so as to assist in heat removal.

Referring to FIG. 6, the fifth preferred embodiment of the present invention differs from the fourth preferred embodiment in that the heat-dissipation device 2 further includes an insulation film 23 attached to the plating metal layer 22 for electrical insulation between the electronic component 100 and the heat-dissipation device 2. In this embodiment, the insulation film 23 is made from polyethylene terephthalate (PET), and the electronic component 100 which needs to be electrically insulated is mounted on the insulation film 23 through the heat conductive adhesive 25.

FIG. 7 illustrates the sixth preferred embodiment of the present invention, comprising a metal panel 24 and a plurality of the planar bodies 21. Each planar body 21 is electroplated with the metal layer 22. The metal panel 24 has a first surface 241, which supports and engages the electronic component 100. The metal panel 24 has an opposite second surface 242, which has a plurality of parallel elongated grooves 243 for receiving the planar bodies 21.

The planar bodies 21 are substantially perpendicular to the second surface of the metal panel 242. One of the first lateral sides 212 of each planar body 21 is inserted into the elongated groove of the metal panel 243. A portion of the metal layer 22 electroplated onto the first lateral side 212 of each planar body 21 is secured to the metal panel 24 by welding, adhesive bonding or other well known methods. The heat generated by the electronic component 100 is transferred to the metal panel 24 and is dissipated through the planar bodies 21.

Figure 8:
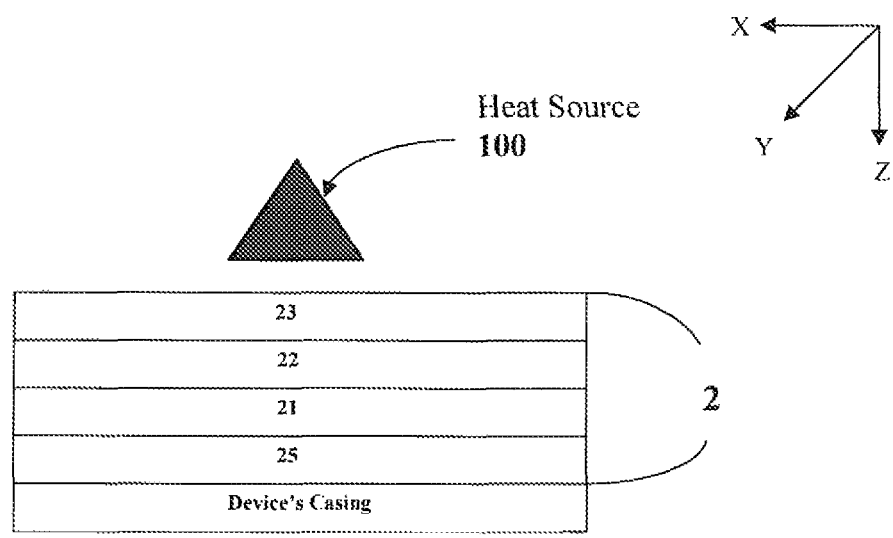
FIG. 8 illustrates schematically a cross sectional view of the seventh preferred embodiment of the heat dissipating device of the present invention.

FIG. 8 illustrates a preferred embodiment of the present invention used in conjunction with an electronic device, such as a computer, mobile internet device, tablet personal computer or a cellular phone. In this embodiment, the bottom surface of the heat-dissipating device 2 is adhered to the interior of the device's casing, a component of the electronic device, printed circuit board, or a heat sink for increased heat-dissipating capacity. The heat sink is made of graphite or metal. The other surface of the heat-dissipating device 2 is in contact with the heat source 100, which includes direct physical contact ,indirect physical contact with the heat source 100 or with one or more layers (such as adhesive) interposed in between. The planar body 21 comprises at least one sheet of flexible graphite. One surface of the planar body is electroplated with one or more metal layers 22. The metal layer 22 comprises copper, nickel, chromium, gold, silver, tin, platinum, or combinations thereof. The metal layer has high thermal conductivity in the Z plane, to effectively conduct heat from the heat source 100 to the graphite planar body 21. In order to achieve the desired mechanical strength and support for the planar body, the thickness of all the metal layers is not less than about 1 μm.

The term "about" as used herein covers the ranges claimed +15%

Figure 9:
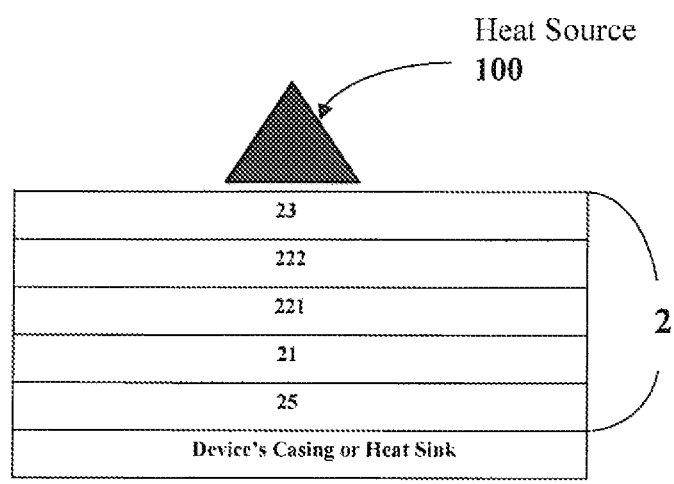
FIG. 9 illustrates schematically a cross sectional view of a preferred embodiment of the heat-dissipating device of FIG. 8.

In one embodiment, as illustrated in FIG. 9, there is more than one metal layer electroplated onto the graphite planar body. Preferably, the graphite planar body is electroplated with a copper film 221 having a thickness ranging from about 7 μm to about 10 μm, followed by electroplating a nickel film 222 thereon. The thickness of the nickel film ranges from about 2 μm to about 5 μm.

An insulation film 23 is optionally adhered to the metal layer. The insulation film 23 may be made of polyethylene terephthalate (PET) or other suitable materials, with a thickness about 0.005 mm to about 0.05 mm. The insulation film prevents the flow of the electric current back to the electronic device.

An adhesive 25 is disposed between the planar body and the electronic device's casing or a heat sink. The adhesive is a double-sided adhesive tape, including a pressure sensitive adhesive coating and a release liner. The thickness of the adhesive is about 0.005 mm to about 0.05 mm.

The surface area of the heat-dissipating device 2 is preferably equal to or larger than the surface are of the heat source 100. Optionally, there are holes along the edge of the heat-dissipating device for inserting fastening means to secure the heat-dissipating device to the heat source 100.

Figure 10:
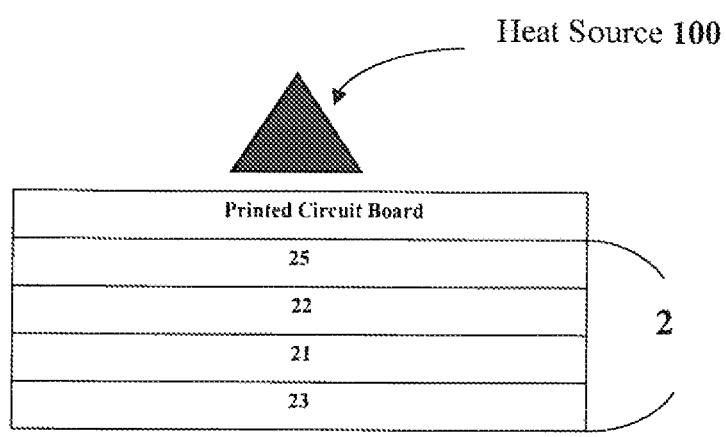
FIG. 10 illustrates schematically a cross sectional view of the eighth preferred embodiment of the heat dissipating device of the present invention.

FIG. 10 illustrates another preferred embodiment of the present invention used in conjunction with an electronic device, such as LCD, LED display panels, or LED lighting with a printed circuit board (PCB), Metal Core PCB, computer, mobile internet device, tablet personal computer, or a cellular phone. In this embodiment, one surface of the heat-dissipating device 2 is adhered to the heat source of the electronic device 100, such as the PCB, or a component of an electronic device. The planar body 21 comprises at least one sheet of flexible graphite. One surface of the planar body is electroplated with one or more metal layers 22. The metal layer 22 comprises copper, nickel, chromium, gold, silver, tin, platinum, or combinations thereof. The metal layer 22 has high thermal conductivity in the Z plane, to effectively conduct heat from the heat source to the graphite planar body. In order to achieve the desired mechanical strength and support for the planar body, the thickness of the metal layers is not less than about 1 μm.

Figure 11:
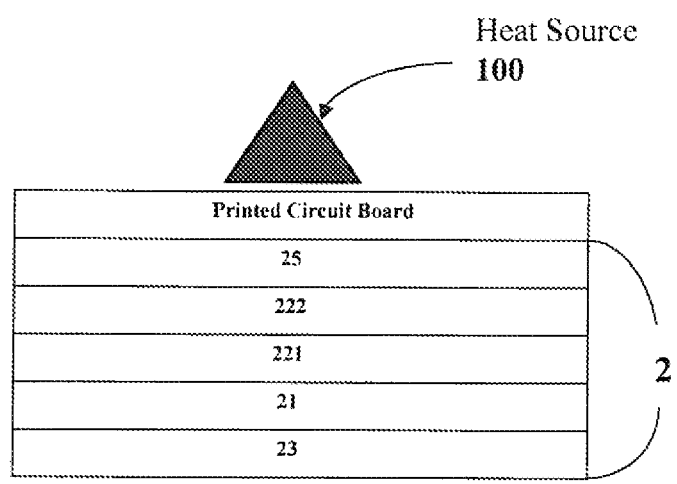
FIG. 11 illustrates schematically a cross sectional view of a preferred embodiment of the heat-dissipating device of FIG. 10.

In one embodiment, as illustrated in FIG. 11, the graphite planar body 21 is electroplated with a copper if .221 having a thickness ranging from about 7 μm to about 10 μm, followed by electroplating a nickel film 222 thereon. The thickness of the nickel film ranges from about 2 μm to about 5 μm.

An insulation film 23 is adhered to the planar body 21. The insulation film 23 may be made of polyethylene terephthalate (PET) or other suitable materials, with a thickness about 0.005 mm to about 0.05 mm.

Optionally, the bottom surface of the graphite device 211 is in contact with a component of the electronic device or a heat sink. This contact includes direct physical or indirect contact. There can be one or more layers interposed between the heat device and the component of the electronic device.

An adhesive 25 is adhered to the metal layer 22 and the heat source 100, and is interposed between said metal layer 22 and the heat source 100. The adhesive is a double-sided adhesive tape, including a pressure sensitive adhesive coating and a release liner. The thickness of the adhesive is about 0.005 mm to about 0.05 mm.

The surface area of the heat-dissipating device 2 is preferably equal to or larger than the surface are of the heat source 100. Optionally, there are holes along the edge of the heat-dissipating device for inserting fastening means to secure the heat-dissipating device to the heat source 100.

The present invention also provides a method for dissipating heat from the heat source 100 in an electronic device. The heat-dissipating device 2 is in contact (direct physical or indirect contact, or with one or more layers interposed in between) with the heat source 100. The heat is generated from the heat source 100 and flows through the thickness of the metal layer 22 in the Z plane. The heat is conducted from the metal layer 22 into the graphite planar body 21 and rapidly spread along the x-y plane.

In summary, the method for dissipating heat from the heat source in an electronic device comprises the following steps:
(a) placing the heat-dissipating device 2 in contact with a heat source 100 in an electronic device;
(b) conducting heat from the heat source 100 across the thickness of the metal layer 22 in Z plane; and
(c) conducting the heat from the metal layer 22 to the planar body 21 and spread along the x-y plane.

The above disclosure is sufficient to enable one of ordinary skill in the art to practice the invention, and provides the best mode of practicing the invention presently contemplated by the inventor. While there is provided herein a full and complete disclosure of specific embodiments of this invention, it is not desired to limit the invention to the exact construction, dimensional relationships, and operation shown and described. Various modifications, alternative constructions, design options, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

We claim:

1. A method, comprising:
   forming a heat dissipating device by:
      cleaning a planar body comprising at least one sheet of flexible graphite by immersing the planar body for approximately 50 sec in a solution including sulfuric acid having a concentration of not less than 0.5 wt % and a surfactant, washing the planar body with water, and immersing the planar body in sulfuric acid having a concentration of 3-5 wt % for approximately 30 sec to produce an acid-cleaned planar body; and
      forming a plating metal layer having a thickness not less than 1 μm onto the acid-cleaned planar body through electroplating;
   placing the plating metal layer of the heat-dissipating device in contact with a heat source in an electronic device;
   conducting heat from the heat source to and across the thickness of the plating, metal layer; and
   conducting the heat from the plating metal layer to the planar body and spreading the heat across a plane defined by the planar body orthogonal to a direction of a thickness of the plating metal layer.

2. The method according to claim 1, wherein the contact is indirect contact and further comprising conducting the heat across an insulating film disposed between the heat source and the plating metal layer of the heat dissipating device.

3. The method according to claim 1, wherein the contact is indirect contact and further comprising conducting the heat across a heat conductive adhesive disposed between the heat source and the plating metal layer of the heat dissipating device.

4. The method according to claim 1, further comprising transferring heat from the heat-dissipating device, wherein at least substantially all of the heat transferred from the heat dissipating device is transferred from surfaces that do not face each other.

5. The method of claim 1, further comprising transferring heat from the heat dissipating device to a casing of the electronic device.

6. The method of claim 1, further comprising transferring heat from the heat dissipating device across an adhesive to a casing of the electronic device.

* * * * *